May 6, 1969

R. A. SANTILLI

GAIN CONTROL BIASING CIRCUITS FOR FIELD-EFFECT TRANSISTORS 3,443,240

Filed Dec. 11, 1967

Sheet 1 of 2

Inventor:
RICHARD A. SANTILLI

BY Eugene M. Whitacre

Attorney

Inventor:
RICHARD A. SANTILLI
By Eugene M. Whitacre
Attorney 3,443,240

GAIN CONTROL BIASING CIRCUITS FOR FIELD-EFFECT TRANSISTORS

Richard A. Santilli, Somerville, N.J., assignor to Radio Corporation of America, a corporation of Delaware Filed Dec. 11, 1967, Ser. No. 689,425
Int. Cl. H03g 3/30
U.S. Cl. 330—29 5 Claims

ABSTRACT OF THE DISCLOSURE

Improved cross modulation performance is obtained in a tetrode insulated gate field-effect transistor amplifier by arranging the automatic gain control circuit so that the voltages of the first and second gate electrodes change in opposite polarity directions relative to the source electrode. The relative bias voltages on the two gate electrodes are established to maintain good cross modulation performance over the automatic gain control voltage range.

This invention relates to high frequency amplifiers using multiple gate field-effect transistors.

Multiple gate field-effect transistors, such as tetrode MOS transistors are field-effect transistors having two or more gate electrodes in addition to the source and drain electrodes. These devices have attractive characteristics for many circuit applications. Some of these characteristics are: (1) high input impedance, (2) good cross-modulation performance, (3) low noise characteristics, (4) simplified direct coupling capability, and (5) compatibility with integrated circuit techniques.

It has been recognzed, in part due to the cross-modulation performance, that multiple gate field-effect transistors are well suited for automatic gain controlled high frequency amplifiers. One such use is disclosed in a patent application filed Nov. 3, 1966, by Leonard Kaplan and O. Philip Hart, Ser. No. 591,821, assigned to the Radio Corporation of America.

MOS field-effect transistors exhibit good cross-modulation performance because their transfer characteristics (drain current $I_D$ as a function of gate voltage $V_G$) closely resembles a quadratic curve. Since cross-modulation, which may be defined as the transfer of information from an undesired carrier to a desired carrier, is largely dependent on third-order components in the transfer characteristics, it becomes more pronounced as the transfer characteristic begins to deviate from a quadratic shape. Or, put another way, cross-modulation becomes more pronounced when a device is operated over a nonlinear range of transconductance. This is so because for a purely quadratic transfer characteristic the transconductance, which may be defined as $dI_D/dV_{G_1}$ for constant drain electrode voltage and constant $V_{G_2}$, is linear. A detailed analysis of cross-modulation in field-effect transistors is given in RCA Application Note, AN–3435, entitled, "Cross-Modulation Effects in Single-Gate and Dual-Gate MOS Field-Effect Transistors." This Application Note can be obtained from the Radio Corporation of America, Electronic Components and Devices, Harrison, N.J.

It is an object of the present invention to provide an automatic gain controlled multiple gate field-effect transistor amplifier circuit having improved cross-modulation performance.

An amplifier circuit embodying the present invention includes a field-effect transistor having a source electrode, a drain electrode, and a plurality of gate electrodes. Input signals are applied to one of the plurality of gate electrodes, and a gain controlling potential is applied to another of the plurality of gate electrodes. A resistor interconnects the source electrode and a point of reference potential. Circuit means interconnect the gate electrodes so that when the gain controlling potential applied to the one gate electrode tends to reduce the gain of the amplifier, the change in potential between another of the gate electrodes and the source electrode is in the opposite direction and is proportioned to change the operating point of the amplifier to maintain low cross modulation distortion.

A complete understanding of the invention may be obtained from the following detailed description of a specific embodiment thereof, when taken in conjunction with the accompanying drawings, in which.

Figure 1:
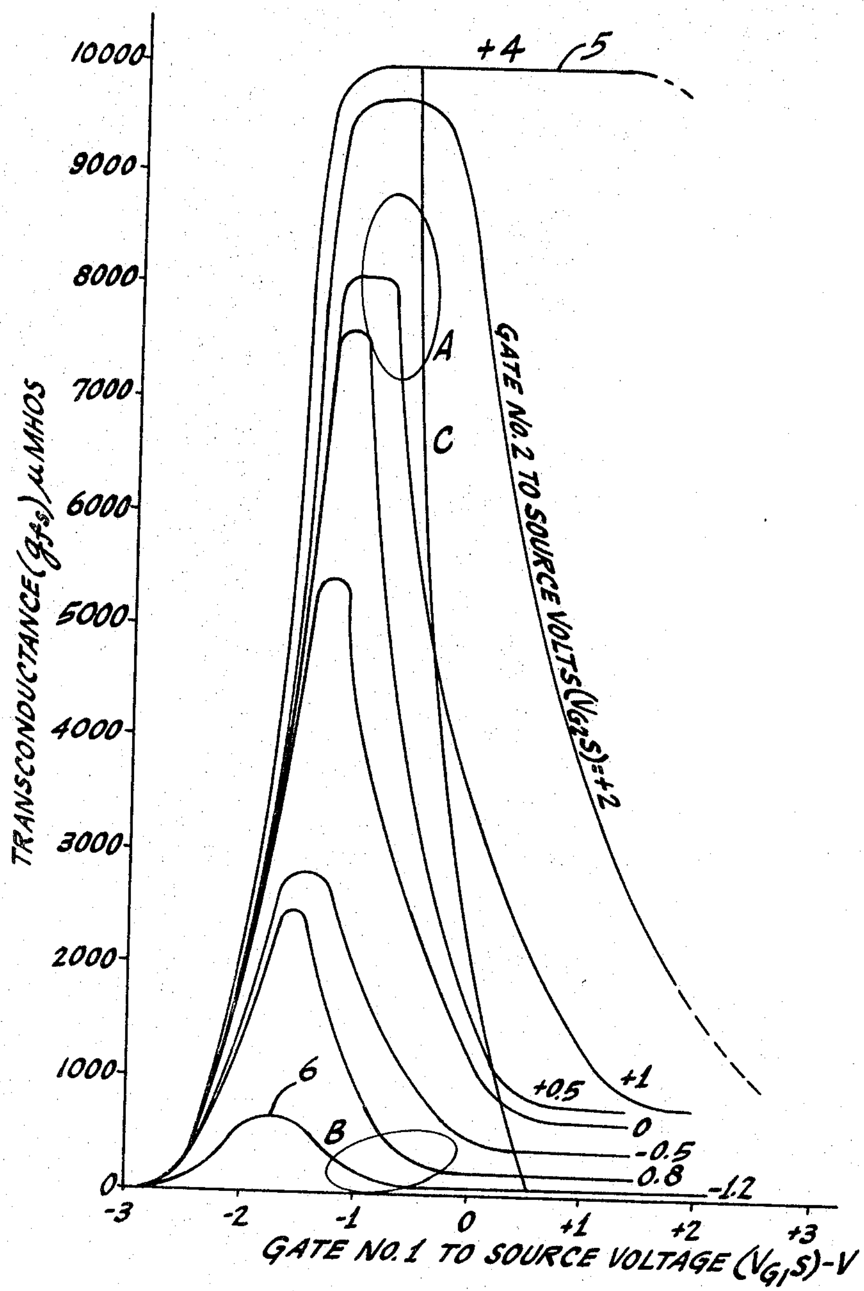
FIGURE 1 is a graph showing a family of transconductance curves for a tetrode MOS field effect transistor.

Reference is now made to FIGURE 1 which shows curves of transconductance as a function of first gate electrode to source electrode voltage $V_{G_1S}$ for several values of second gate electrode to source electrode voltage $V_{G_2S}$ for a tetrode MOS field-effect transistor. The circled areas A and B show a nonlinear transconductance region as the device is gain reduced by application of reverse bias to the second gate electrode. Third-order effects are introduced in these regions as the transfer characteristic varies with second gate electrode bias. For optimum bias condition, that is, for bias conditions leading to minimum cross-modulation, it is desirable to pass through regions of nonlinearity as quickly as possible. In other words, the nonlinear region of transconductance is traversed over a relatively small range of votage $V_{G_2S}$. It can be seen from the curves that if a bias condition obtains such that when $V_{G_2S}$ varies from an initial maximum value represented by the curve 5 to a final minimum value represented by the curve 6, while $V_{G_1S}$ varies from an initial value (i.e., negative 0.6 volt) to a final value (i.e., positive 0.5 volt), the nonlinear regions of transconductance will be traversed quickly. The selection of operating conditions which establishes the slope of curve C may be somewhat restricted because of the relatively low voltage rating of gate No. 1. Curve C shows a representative biasing curve taking into account the breakdown limitation, and yet providing excellent cross-modulation performance.

Figure 2:
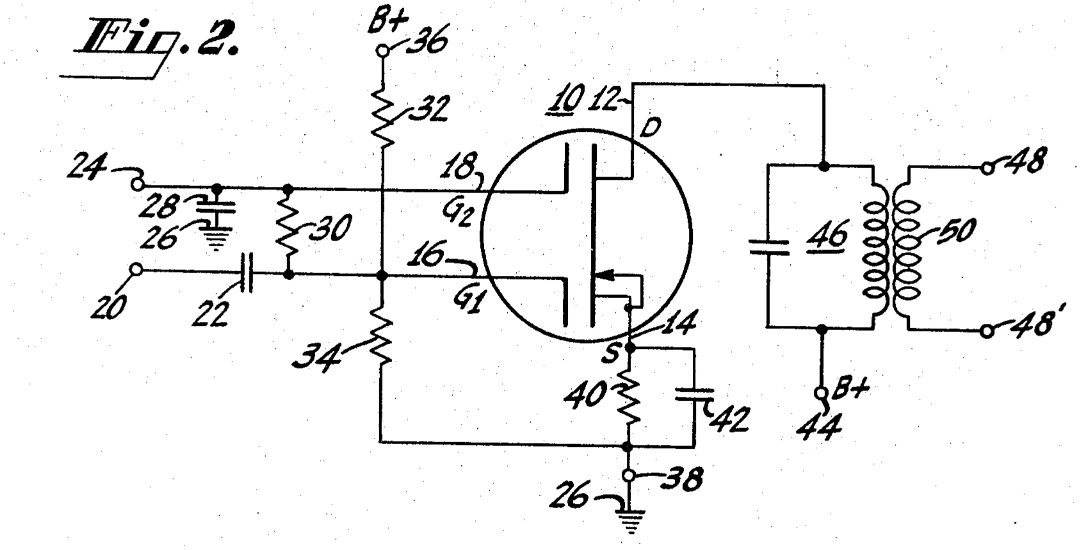
FIGURE 2 is a schematic circuit diagram of an automatic gain controlled tetrode field-effect transistor amplifier circuit embodying the present invention.

Reference is now made to FIGURE 2 which is a schematic circuit diagram of a radio frequency amplifier circuit including a tetrode MOS field-effect transistor 10 having a drain electrode 12, a source electrode 14, a first gate electrode 16, and a second gate electrode 18. High frequency signals to be amplified are applied at an input terminal 20 and passed through a blocking capacitor 22 to the first gate electrode 16. A gain controlling potential is applied to an automatic gain control input terminal 24 which is directly connected to the second gate electrode 18. High frequency signals at the gain control terminal 24 are bypassed to a ground 26 by a capacitor 28.

A resistor 30 interconnects the first gate electrode 16 and the second gate electrode 18. Two serially connected resistors 32 and 34 interconnect a terminal 36 and a terminal 38. The junction of the resistors 32 and 34 is connected to the first gate electrode 16. Terminal 36 is adapted to be energized by a source of positive potential, not shown, and the terminal 38 is connected to a reference potential shown as ground 26.

Because there is often substantial variation in the drain current from one field-effect transistor to the next for a given gate bias condition, it is desirable to provide DC degeneration and thereby reduce variations in the drain current of production units. Thus, a resistor, which is bypassed by a capacitor 42, interconnects the source electrode 14 and the grounded terminal 38 and provides the desired DC degeneration. The inclusion of the resistor 40, however, causes the voltage at the source electrode to vary as the drain current changes. That is, the $I_DR_{40}$ voltage drop varies as the drain current $I_D$ changes in response to changes in AGC voltage.

A source of positive operating potential for the transistor 10 is provided by a power supply, not shown, connected to a terminal 44. A tuned circuit 46 connects the source of potential at the terminal 44 and the drain electrode 12. Output signals are developed between the terminals 48 and 48′ which are connected to an inductor 50, coupled to the tuned circuit 42.

To determine the circuit parameters for optimum cross modulation performance, the voltages applied to the gate electrodes 16 and 18 which provide best cross modulation performance at maximum gain are determined. A similar determination of the gate electrode 16 and 18 voltages at minimum gain may be made. As a practical matter, with the available devices, the gate 16 voltage for best cross modulation performance at minimum gain exceeded the maximum specified voltage for that electrode. As a compromise, the gate 16 voltage which provided the optimum performance of the device within its specified rating was selected. It was found that the voltage of the gate electrode 16 had to become more positive relative to the source electrode 14 to maintain the best cross-modulation performance as the gain was reduced.

After determining the maximum and minimum limit voltages for the gate electrodes 16 and 18 as described above, a network was designed to approximate these voltages at the limits of the AGC range. Such a network is shown in FIGURE 2 as including the resistors 30, 32 and 34 operating in connection with the voltage developed across the resistor 40.

Figure 3:
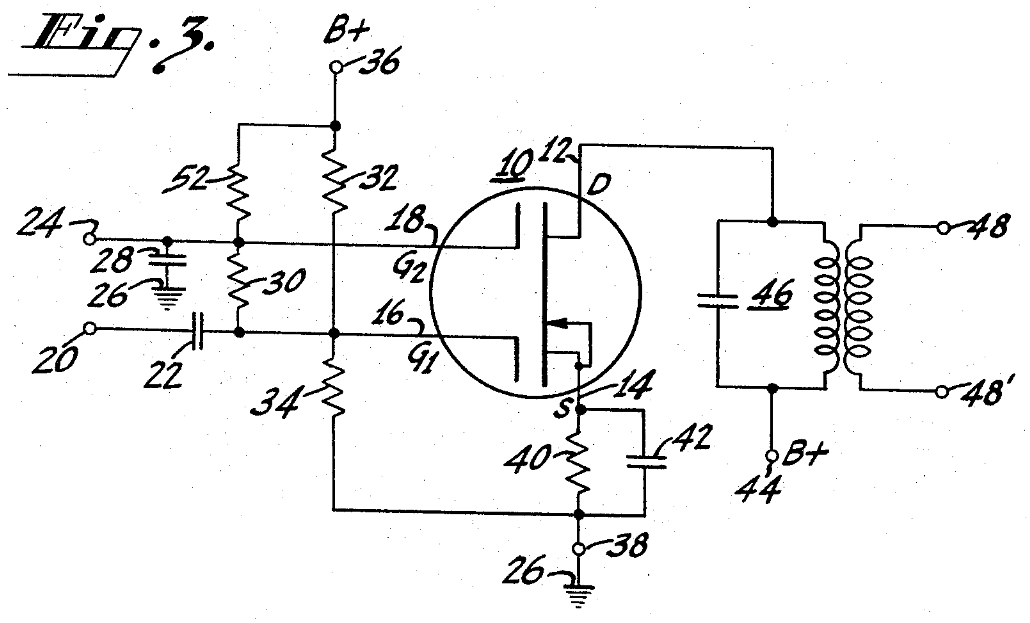
FIGURE 3 is a schematic circuit diagram of the bias circuit shown in FIGURE 1 with provision for establishing a gain controlling potential reference level.

The circuit of FIGURE 3 is similar to that of FIGURE 2 except that a resistor 52 is connected between the gate 18 and the positive potential terminal 36. This permits a greater degree of flexibility in designing the AGC network to meet the voltages established for optimum cross-modulation performance at the amplifier maximum and minimum gain conditions.

In operation, an AGC voltage is applied to the terminal 24. The AGC voltage which may be derived in a known manner varies as a function of the level of the signal applied to the terminal 20. As the AGC voltage becomes more negative (or less positive), the gain of the amplifier decreases.

It will be noted that as the voltage applied to the gate electrode 18 becomes more negative, the voltage at the source electrode 14 also becomes more negative. As viewed from the gate electrode 16, the effect is to make the gate electrode 16 relatively more positive with respect to the source electrode 14. The amount of AGC voltage applied to the gate electrode 16 (by the voltage divider resistors 30 and 34) will determine the extent of this variation. The initial and final voltages at the gate electrodes 16 and 18 over the AGC range is also determined by the voltage divider resistors from the respective gate electrodes to the positive potential terminal 36. In the embodiment shown in FIGURE 3, the voltage at gate electrode 18 varied between +6.2 volts and −4 volts, and at gate electrode 16 between −0.6 volt and +0.5 volt as the AGC voltage varies from the maximum to the minimum gain conditions.

A particular set of values for the circuits shown in the drawings which have provided satisfactory operation are set forth below. It will be appreciated that these values are by way of example only.

FIGURE 3

| | |
|---|---|
| Transistor 10 | RCA 3N140 |
| Capacitor 22 ______ picafarads | 1,000 |
| Capacitor 26 ______ do | 1,000 |
| Capacitor 42 ______ do | 1,000 |
| Resistor 30 ______ ohms | 150,000 |
| Resistor 32 ______ do | 300,000 |
| Resistor 34 ______ do | 27,000 |
| Resistor 40 ______ do | 270 |
| B+ (terminals 36, 44) ______ volts | 15 |

It is to be understood that a P-channel semiconductor circuit structure could be utilized in place of the N-channel device shown, with corresponding changes in the polarity of the source of operating potential.

What is claimed is:

1. An amplifier circuit comprising:
a field effect transistor having a source electrode, a drain electrode, and a plurality of gate electrodes;
input circuit means coupled to a first of said plurality of gate electrodes;
a gain controlling potential supply means connected to a second of said plurality of gate electrodes;
circuit means interconnecting said first gate electrode, said second gate electrode and said source electrode to cause the potential of said first gate electrode relative to said source electrode to change in a polarity direction opposite to that of said second gate electrode relative to said source electrode.

2. An amplifier circuit comprising:
a field effect transistor having a source electrode, a drain electrode, and a plurality of gate electrodes;
means for applying input signals to a first of said plurality of gate electrodes;
means for applying a gain controlling potential to a second of said plurality of gate electrodes;
a resistor connected to said source electrode; and
circuit means for interconnecting said first gate electrode and said second gate electrode so that the potential of said first gate electrode relative to said source electrode changes in a polarity direction opposite to that of said second gate electrode relative to said source electrode.

3. An amplifier circuit comprising:
a field effect transistor having a source electrode, a drain electrode, and first and second gate electrodes;
input circuit means coupled between said first gate electrode and a point of reference potential;
gain controlling potential supply means connected between said second gate electrode and said point of reference potential;
a first resistor connected between said source electrode and said point of reference potential;
circuit means including a second resistor connected between said first and second gate electrodes, and a third resistor connected between said first gate electrode and said point of reference potential proportioned to cause the potential of said first gate electrode relative to said source electrode to change in a polarity direction opposite to that of said second gate electrode relative to said source electrode; and
means including a fourth resistor for applying a bias voltage to one of said first and second gate electrodes.

4. An amplifier circuit as defined in claim 3 wherein said fourth resistor interconnects a source of potential and said second gate electrode.

5. An amplifier circuit as defined in claim 3 including a fifth resistor interconnecting said source of potential and said second gate electrode.

References Cited

UNITED STATES PATENTS 3,404,347 10/1968 Kaplan et al. ---------- 330—29

ROY LAKE, *Primary Examiner.*
J. B. MULLINS, *Assistant Examiner.*

U.S. Cl. X.R.

330—35, 38